United States Patent
Jayapalan et al.

(10) Patent No.: US 7,272,884 B2
(45) Date of Patent: Sep. 25, 2007

(54) DESIGN AND FABRICATION OF INDUCTORS ON A SEMICONDUCTOR SUBSTRATE

(75) Inventors: Jayakannan Jayapalan, San Jose, CA (US); Shuxian Chen, Fremont, CA (US); Liping Li, Campbell, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/638,631

(22) Filed: Dec. 12, 2006

(65) Prior Publication Data

US 2007/0090914 A1 Apr. 26, 2007

Related U.S. Application Data

(62) Division of application No. 10/893,089, filed on Jul. 16, 2004, now Pat. No. 7,170,382.

(51) Int. Cl.
*H01F 7/06* (2006.01)
(52) U.S. Cl. .......................... 29/606; 336/200
(58) Field of Classification Search .......... 336/65, 336/83, 200, 225, 229, 232; 29/599, 602.1, 29/606
See application file for complete search history.

(56) References Cited

U.S. PATENT DOCUMENTS

| | | | | |
|---|---|---|---|---|
| 3,319,207 A | * | 5/1967 | Davis | 336/229 |
| 3,874,075 A | * | 4/1975 | Lohse | 29/602.1 |
| 4,724,603 A | * | 2/1988 | Blanpain et al. | 29/606 |
| 6,990,729 B2 | * | 1/2006 | Pleskach et al. | 336/229 |

* cited by examiner

*Primary Examiner*—Tuyen T. Nguyen
(74) *Attorney, Agent, or Firm*—Morgan, Lewis & Bockius LLP

(57) ABSTRACT

The present invention is directed to an inductor fabricated above a substrate surface comprising a first set of inductors in a lower dielectric layer, a second set of inductors in an upper dielectric layer, and interconnects extending between the first and second sets of conductors to form a single continuous helical current path that turns around a central region. Since each turn of the inductor includes only one leg close to the substrate, the parasitic capacitance between the inductor and the substrate can be reduced and there is more free space in the upper and lower layers for increasing the width of the conductors and thereby reducing the series resistance of the inductor. Meanwhile, since the magnetic field generated by the inductor is substantially confined in a closed tube defined by its turns, there is less interference between the inductor and its neighboring components on the same and/or surrounding substrates.

20 Claims, 8 Drawing Sheets

DESIGN AND FABRICATION OF INDUCTORS ON A SEMICONDUCTOR SUBSTRATE

The present application is a divisional of U.S. application Ser. No. 10/893,089, filed Jul. 16, 2004, now U.S. Pat. No. 7,170,382 which application is incorporated herein by reference in its entirety.

The present invention relates generally to the fabrication of an integrated circuit on a semiconductor substrate and, in particular, to the design and fabrication of an inductor on the semiconductor substrate that has minimal interference with the underlying substrate and its neighboring components.

BACKGROUND OF THE INVENTION

An important trend in modern semiconductor technology is the design and fabrication of an integrated circuit (IC) on a semiconductor substrate that includes not only components processing digital signals, e.g., programmable logic devices (PLD), but also components that manipulate analog signals, e.g., capacitors and inductors. Such a mixed-signal type of IC device is particularly useful in wireless applications. For example, a key component of a digital cellular phone is a radio frequency (RF) tuned circuit that can pass or reject analog signals at a certain frequency band. If the tuned circuit is integrated with other components of the phone on a substrate surface, it may significantly reduce the size of the phone as well as its noise level and power consumption.

A crucial component in the tuned circuit is a LC circuit comprising at least one inductor and one capacitor, whose self-resonant frequency determines the frequency range over which the cellular phone can be operated. The LC circuit's self-resonant frequency increases with its inductor's inductance. Since inductance increases with physical size of the inductor, a higher self-resonant frequency requires a physically larger inductor. To attain a required inductance for certain applications, the inductor can be of significant physical size and if implemented in a semiconductor device, requires a large surface area of the semiconductor substrate. To offset this requirement for large physical size, the inductor is typically formed on the surface of a substrate in a spiral form in two dimensions.

FIG. 1 is 2-D a plain view of a prior art horizontal spiral inductor fabricated on the surface of a semiconductor substrate 100. The spiral inductor includes four turns and two input/output terminals 120 and 140, all formed in the same layer of metallization on top of a semiconductor substrate. Since all four legs of each turn of the spiral inductor are located on the same horizontal surface close to the substrate, this may cause a serious parasitic capacitance between the spiral inductor and the underlying substrate. This parasitic capacitance not only may increase the noise level and power consumption of the application including the spiral inductor but also may reduce the self-resonant frequency of any tuned circuit incorporating the spiral inductor.

In view of the discussion above, it is highly desirable to design an inductor has a large inductance, but occupies limited area on the surface of a semiconductor substrate. It is also desirable that this inductor cause little noise in its neighboring components.

SUMMARY OF THE INVENTION

The present invention is directed to an inductor fabricated on a surface of a semiconductor substrate. This inductor comprises a first set of conductors in a lower dielectric layer, each conductor extending from a central region in the lower layer, a second set of inductors in an upper dielectric layer, each conductor extending from a central region in the upper layer, and a plurality of interconnects extending between selected ends of individual conductors of the first set and selected ends of individual conductors of the second set so as to form a single continuous helical current path through the conductors and the interconnects. This helical current path comprises multiple turns forming a closed tube surrounding the central regions in the upper and lower layers.

Each turn of the inductor includes two horizontal legs, one in the upper layer and the other in the lower layer, and two vertical legs. Since there is only one leg in each turn of the inductor close to the substrate, the parasitic capacitance between the inductor and the substrate is substantially reduced and there is more free space available in the upper and lower layers for increasing the width of the conductors in the layers and thereby reducing the series resistance of the inductor. Meanwhile, the magnetic field generated by an electric current passing through the inductor is substantially confined in the closed tube defined by the turns of the inductor, which makes it less likely for the inductor to interfere with its neighboring components on the same and/or surrounding substrates.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

Like reference numerals refer to corresponding parts throughout the several views of the drawings.

DETAILED DESCRIPTION OF THE EMBODIMENTS

The present invention is directed to an inductor fabricated on a surface of a semiconductor substrate. This inductor comprises a first set of conductors in a lower dielectric layer, each conductor extending from a central region in the lower layer, a second set of conductors in an upper dielectric layer, each conductor extending from a central region in the upper layer, and a plurality of interconnects extending between selected ends of individual conductors of the first set and selected ends of individual conductors of the second set so as to form a single continuous helical current path through the conductors and the interconnects. This helical current path comprises multiple turns forming a closed tube surrounding the central regions in the upper and lower layers.

Figure 2A:
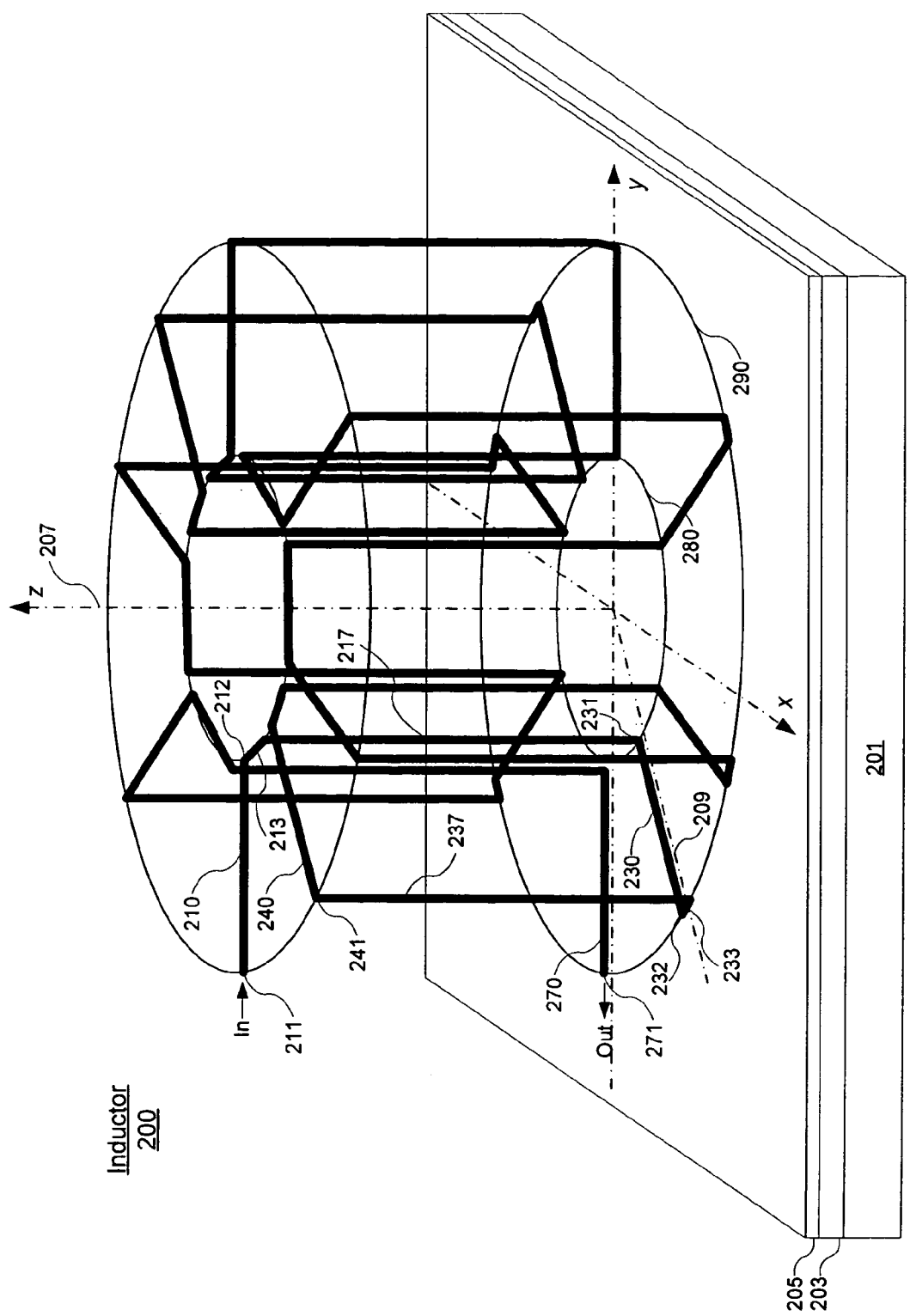
FIGS. 2A and 2B are respective 3-D perspective and 2-D plain views of an inductor fabricated in a circular form on the surface of a semiconductor substrate in accordance with a first embodiment of the present invention.
Figure 2B:
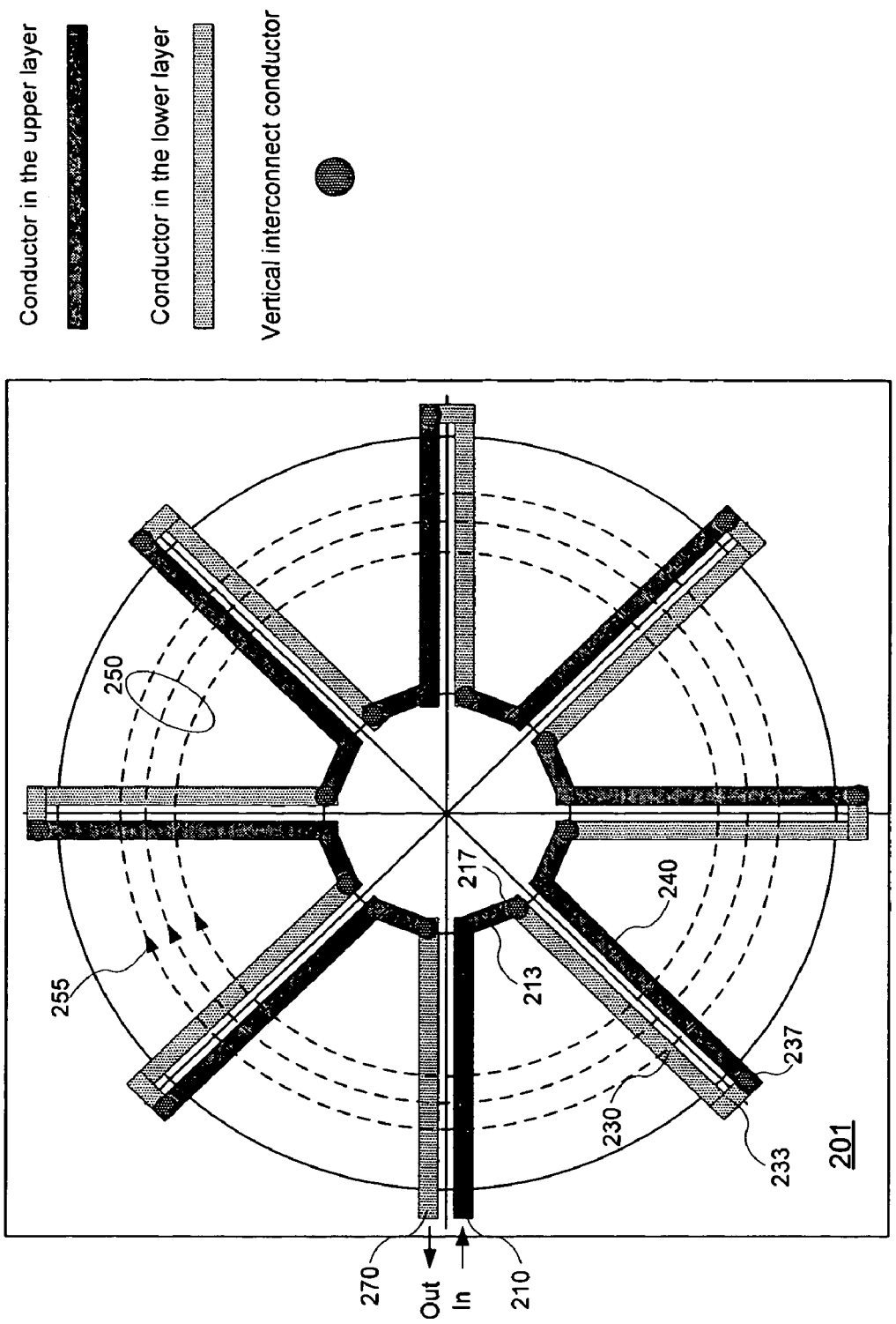

FIGS. 2A and 2B are respective 3-D perspective and 2-D plain views of an inductor 200 fabricated in a circular form on the surface of a semiconductor substrate 201 in accordance with a first embodiment of the present invention. As shown in FIG. 2A, the inductor 200 is separated from the substrate 201 by at least one dielectric layer 203. The bottom of the inductor 200 includes a set of conductors evenly distributed in a lower dielectric layer 205, each conductor extending between an inner circle 280 and an outer circle 290. For example, the conductor 230 extends along the radial line 209 from the central axis 207, and it has an inner end 231 on the inner circle 280 and an outer end 232 on the outer circle 290. The top of the inductor 200 includes another set of conductors deployed similarly in an upper dielectric layer (not shown), each conductor in the upper layer having a counterpart in the lower layer. For example, the counterpart of the conductor 210 in the upper layer is the conductor 270 in the lower layer and the two conductors are actually parallel to each other. In some other embodiments, they may not be parallel to each other.

Starting with the conductor 210, there are a plurality of metal interconnects extending between selected ends of individual conductors in the upper layer and selected ends of individual conductors in the lower layer. Specifically, the interconnect 217 connects the inner end 212 of the conductor 210 in the upper layer with the inner end 231 of the conductor 230 in the lower layer, and the interconnect 237 connects the outer end 232 of the conductor 230 with the outer end 241 of the conductor 240. Note that there are small conductive segments 213 and 233 linking the conductor 210 with the interconnect 217 and the conductor 230 with the interconnect 237, respectively. As a result, the two interconnects 217 and 237 are actually vertical to the upper and lower layers. In some other embodiments, these interconnects may not be vertical to the upper and lower layers. Furthermore, the two conductors (210 and 230) linked by the interconnect 217 are actually not counterparts to each other, while the two conductors (230 and 240) linked by the interconnect 237 are counterparts to each other. This connecting pattern repeats itself until all the conductors in the upper and lower layers are serially connected by the interconnects into a continuous helical current path that terminates at the conductor 270, forming a circular solenoid on the substrate surface that has eight turns.

FIG. 2B shows that the eight turns of the circular solenoid are evenly spaced in a radiating manner above the substrate 201 and they define a circular tube 250 inside the circular solenoid. Note that different fill patterns in the figure represent conductors and interconnects at different locations. An electric current entering the circular solenoid at the conductor 210 and leaving at the conductor 270 generates a magnetic field inside the circular cube 250 as represented by the clockwise magnetic field lines 255. In contrast, an electric current entering the circular solenoid at the conductor 270 and leaving at the conductor 210 will generate a magnetic field inside the circular cube 250 whose direction is opposite to that of the magnetic field lines 255, i.e., counter-clockwise.

Figure 1:
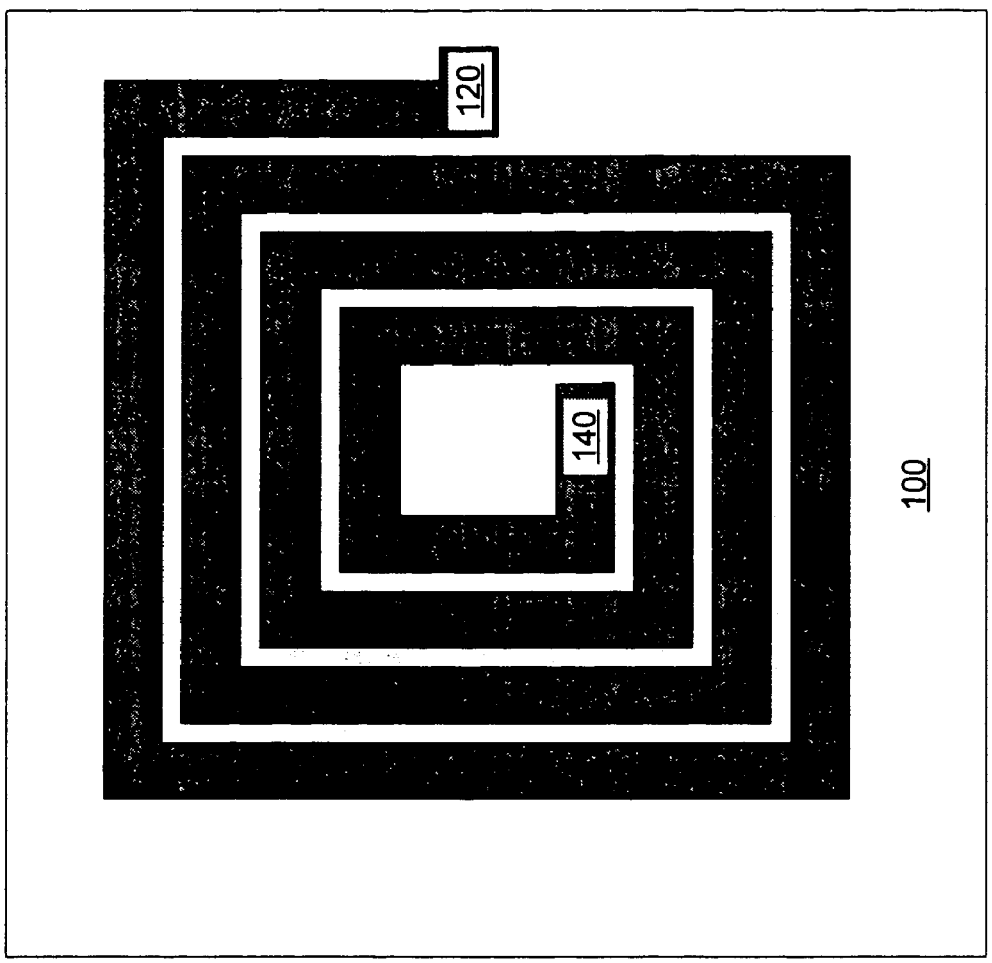
FIG. 1 is a 2-D plain view of a prior art horizontal spiral inductor fabricated on the surface of a semiconductor substrate.

There are a number of structural features that distinguish the inductor 200 from a conventional horizontal spiral inductor shown in FIG. 1. For example, the light fill represents conductors in the lower layer and the dark fill conductors in the upper layer. Each turn of the inductor includes two horizontal legs (e.g., the horizontal conductors 230 and 240) and two vertical legs (e.g., the vertical conductors 217 and 237). Since there is only one leg, i.e., the conductor 230, close to the substrate 201, the parasitic capacitance between each turn of the inductor and the substrate can be reduced significantly. Second, there is more free space in the upper and lower layers, because each layer only hosts one horizontal leg of each turn of the inductor. As a result, it is possible to increase the width of the conductors in the upper and lower layers and thereby reduce the total series resistance of the inductor and an application incorporating this type of low-resistance inductor may consume less power. Third, the magnetic field generated by the inductor is substantially confined within the circular tube defined by the turns of the inductor, which makes it less likely for the inductor to interfere with its neighboring components on the same and/or surrounding substrates.

Figure 3A:
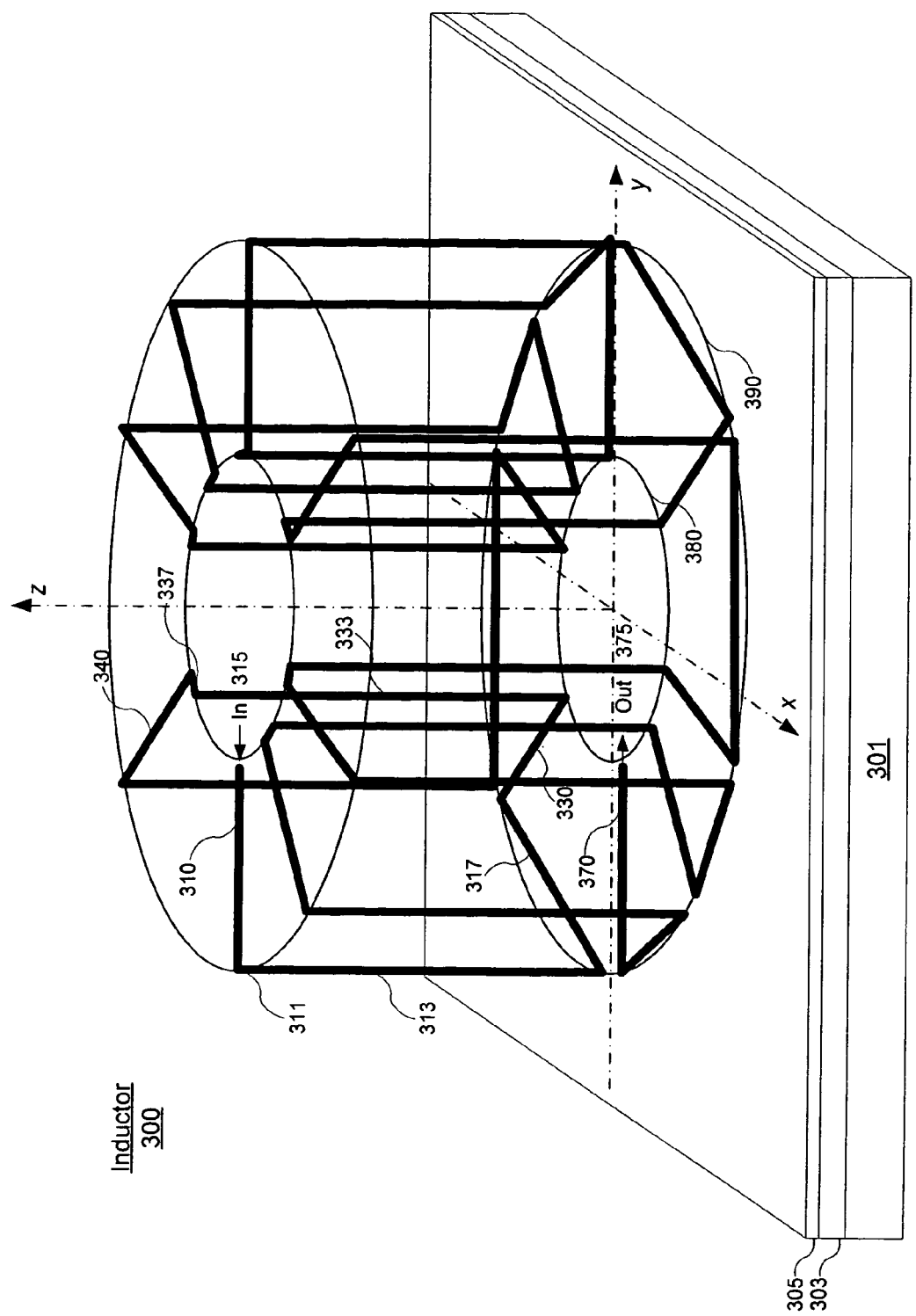
FIGS. 3A and 3B are respective 3-D perspective and 2-D plain views of an inductor fabricated in a circular form on the surface of a semiconductor substrate in accordance with a second embodiment of the present invention.
Figure 3B:
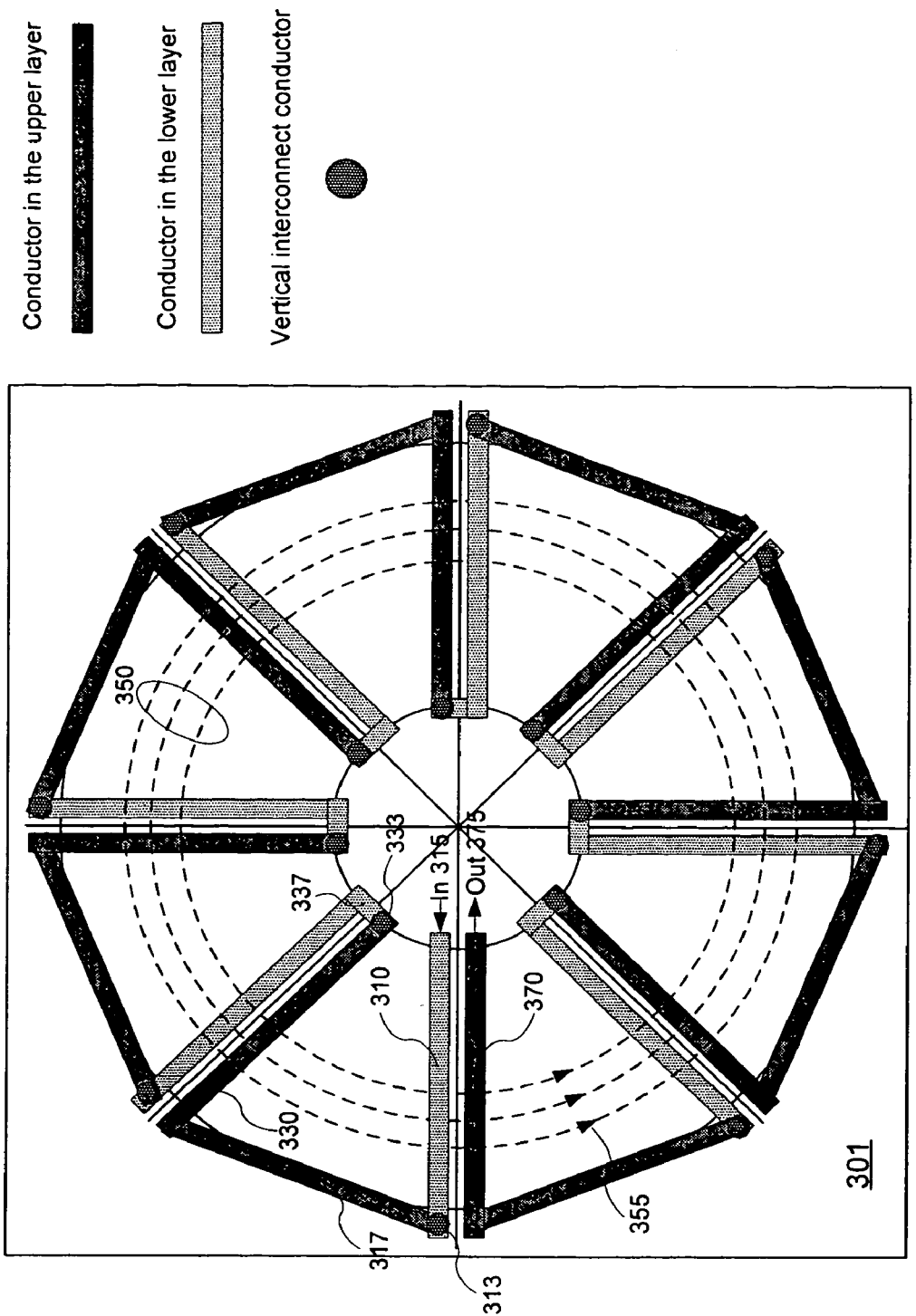

FIGS. 3A and 3B are respective 3-D perspective and 2-D plain views of an inductor fabricated in a circular form on the surface of a semiconductor substrate in accordance with a second embodiment of the present invention. As shown in FIG. 3A, the deployment of the conductors in the upper and lower layers according to the second embodiment is similar to that of the first embodiment. There are two sets of conductors, one in the upper layer and the other in the lower layer, each conductor extending along a radial line from a central axis. What is unique in the second embodiment is that the two conductors (e.g., 310 and 330) whose outer ends are linked together by an interconnect (e.g., 313) using a conductive segment (317) are not parallel to each other, while two conductors (e.g., 330 and 340) whose inner ends are linked together by an interconnect (e.g., 333) using a conductive segment (337) are actually parallel to each other. As a result, the conductive segments (e.g., 317) linking two outer ends in this embodiment are longer than those (e.g., 233) in the first embodiment.

FIG. 3B further illustrates that an electric current that enters the inductor on the conductor 310 and leaves on the conductor 370 generates a magnetic field inside the circular tube 350 as represented by the counter-clockwise magnetic field lines 355. Therefore, the inductor in accordance with the second embodiment shares a similar set of structural features as discussed above in connection with the first embodiment.

Figure 4:
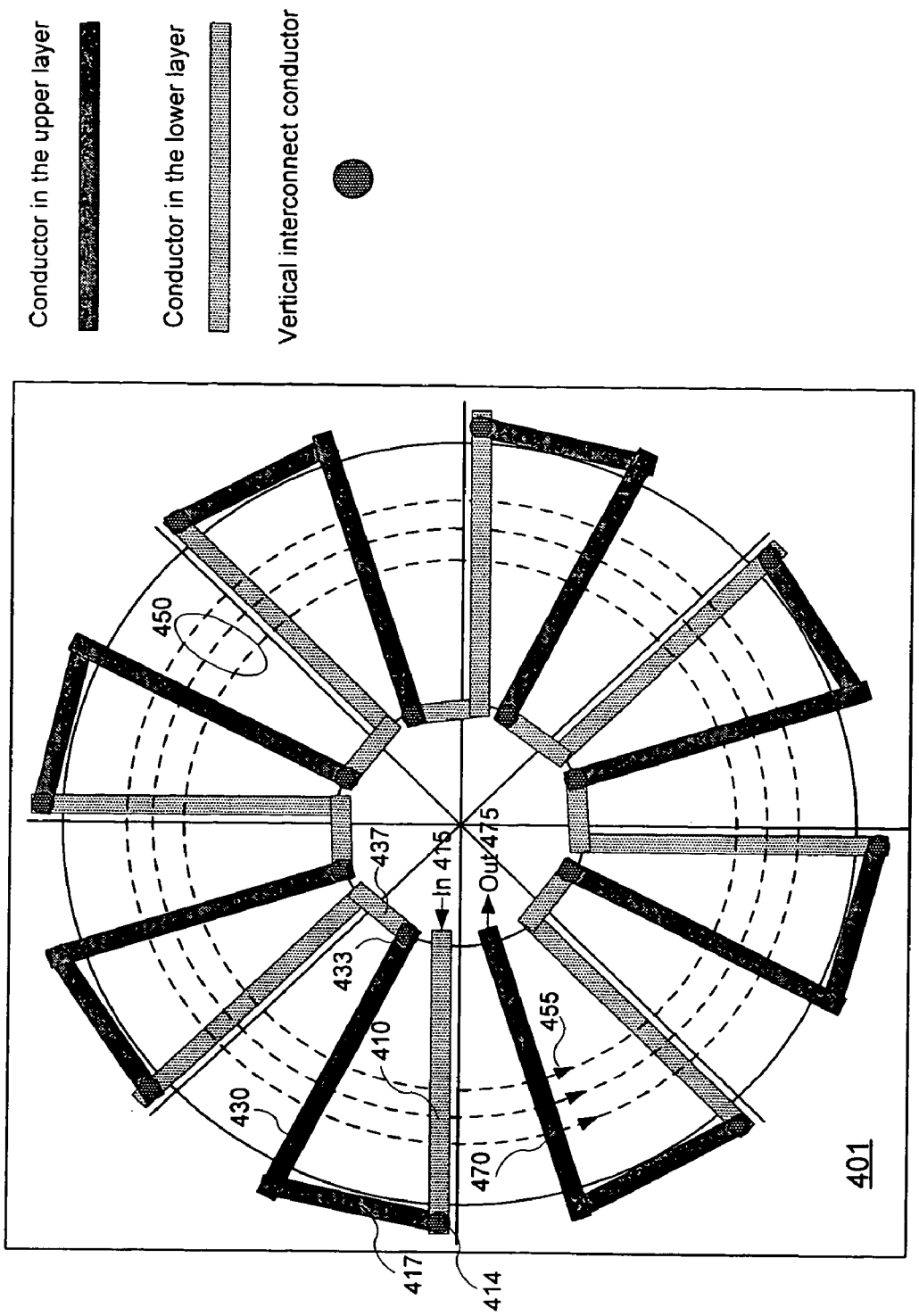
FIG. 4 is a 2-D plain view of an inductor fabricated in a circular form on the surface of a semiconductor substrate in accordance with a third embodiment of the present invention.

What is common among the previous two embodiments is that each turn of the inductor comprises two parallel horizontal legs (e.g., the conductors 230 and 240) and two parallel vertical legs (e.g., the conductors 217 and 237). In contrast, FIG. 4 illustrates a third embodiment in which the two horizontal legs are not parallel to each other. Instead, the projection of a conductor (e.g., 410) in the upper layer forms a fixed angle with the projection of its counterpart conductor (e.g., 470) in the lower layer. The two sets of conductors are linked together by metal interconnects between the two layers, forming a single continuous helical current path that has eight turns. Accordingly, an electric current that enters the current path on the conductor 410 and exits on the conductor 470 generates a counter-clockwise magnetic field in a circular tube 450.

Figure 5:
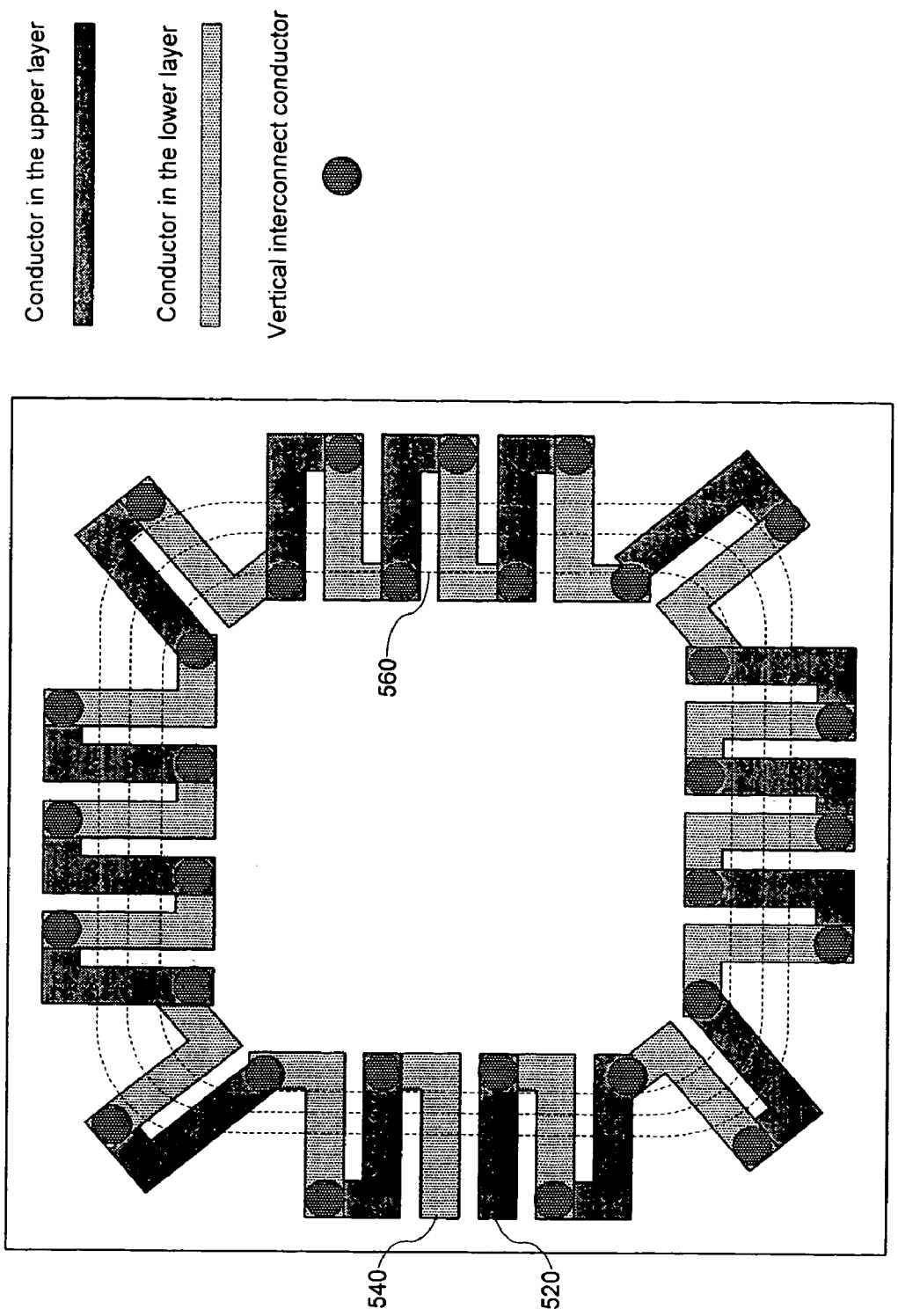
FIG. 5 is a 2-D plain view of an inductor fabricated in a rectangular form on the surface of a semiconductor substrate in accordance with a fourth embodiment of the present invention.

In the previous three embodiments, the helix-shaped current path defines a circular tube above the substrate surface, because all the conductors are arranged to extend outwards from a circle. Practically speaking, the tube defined by the conductors and interconnects does not have to be circular. The benefits discussed above in conjunction with the circular tube can be readily found in other types of configuration, e.g., a polygon-shaped tube, as long as they generate a closed-loop magnetic field. For example, FIG. 5 is a 2-D plain view of an inductor fabricated in a rectangular form on the surface of a semiconductor substrate in accordance with a fourth embodiment of the present invention. In this case, there are also two sets of conductors in two horizontal layers, and each set is deployed along the four edges of the underlying substrate. These two sets of conductors are linked together by metal interconnects between the two layers at selected locations to form an inductor having multiple turns. Accordingly, when an electric current enters into the inductor on conductor 520 and exits on conductor 540, a magnetic field is generated in a rectangular tube defined by the inductor, which has little interference with other components on the same or surrounding substrates. In some embodiments, the conductors in the each layer are arranged to extend outwards from an oval or an ellipse. Accordingly, the magnetic field generated by the conductors will be in an oval or an elliptical tube.

In some other embodiments, the two ends of the inductor are on the same horizontal layer. In this case, the number of conductors in the two layers may be different. In yet some other embodiments, the inductor may comprise four sets of conductors in four different layers with two sets of conductors in the uppermost and lowermost layers forming a first helical current path and the two sets of conductors in the two inner layers forming a second helical current path which is serially connected with the first helical current path. Depending upon the electric current directions in these two paths, the magnetic field generated by the second helical current path may strengthen or attenuate the magnetic field generated by the first helical current path.

Figure 6:
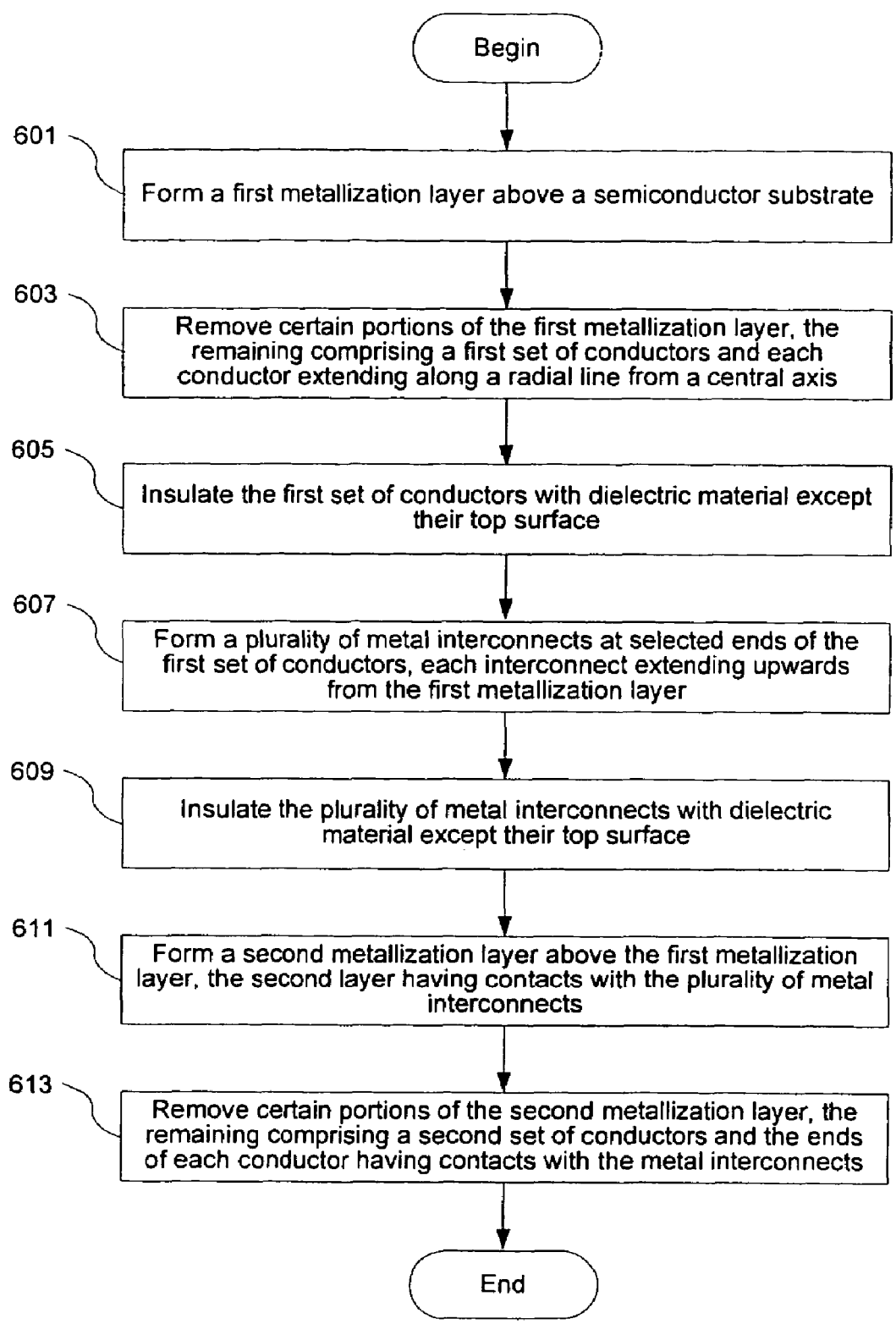
FIG. 6 is a flow chart illustrating the process of fabricating an inductor on the surface of a semiconductor substrate.

FIG. 6 is a flow chart illustrating the process of fabricating an inductor on the surface of a semiconductor substrate in accordance with one embodiment of the present invention. To generate such a radiating pattern of conductors, a first metallization layer is formed at step 601 on a dielectric layer 205 above a semiconductor substrate, using certain deposition techniques known in the art, e.g., chemical vapor deposition (CVD). Next, in step 603, certain portions of the first metallization layer are removed, and the remaining of the first metallization layer becomes a first set of conductors, resulting in a radiating pattern of disconnected conductors above the substrate surface. The first set of conductors are then insulated at step 605 with dielectric material. Additional layers of metallization and of dielectric material may be formed. Next, in step 607, a plurality of metal interconnects are formed at selected ends of the first set of conductors, each interconnect extending downwards from the surface of the uppermost dielectric layer to the first metallization layer. A second metallization layer is then formed at step 611 on the uppermost dielectric layer and in contact with the plurality of metal interconnects. Finally, in step 613, certain portions of the second metallization layer are removed to form a second set of conductors whose ends are electrically coupled to the metal interconnects below the second metallization layer.

The foregoing description, for purpose of explanation, has been made with reference to specific embodiments. However, the illustrative embodiments described above are not intended to be exhaustive or to limit the invention to the precise forms disclosed.

Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of forming an inductor above a surface of a semiconductor substrate, comprising:
    forming a first set of conductors in a lower dielectric layer, each conductor extending from a central region in the lower dielectric layer;
    forming a second set of conductors in an upper dielectric layer, each conductor extending from a central region in the upper dielectric layer; and
    forming a plurality of interconnects extending between individual conductors of the first set and individual conductors of the second set so as to form a single continuous helical current path through the conductors and the interconnects wherein the helical current path also turns around the central regions in the upper and lower dielectric layers.

2. The method of claim 1, wherein each conductor of the first and second sets is evenly distributed in an annular region of the lower and upper dielectric layers, the region being defined by a pair of co-centric closed loops including a small one and a large one that have a similar shape.

3. The method of claim 2, wherein the shape of the pair of co-centric closed loops is selected from the group consisting of circle, oval, and polygon.

4. The method of claim 1, wherein the conductors and interconnects constituting the helical current path are insulated by dielectric material.

5. The method of claim 1, wherein the helical current path has first and second terminals, the first and second terminals being associated with first and second conductors of the first and second sets, respectively.

6. The method of claim 1, wherein each conductor of the first set is substantially parallel to a respective conductor of the second set.

7. The method of claim 6, wherein the conductor of the first set is electrically coupled to the respective conductor of the second set by a respective interconnect.

8. A method of forming an inductor above a surface of a semiconductor substrate, comprising:
    forming a first set of conductors in a lower dielectric layer, each conductor extending along a radial line from a central axis;
    forming a second set of conductors in an upper dielectric layer, each conductor extending along a radial line from the central axis; and
    forming interconnects extending between individual conductors of the first set and individual conductors of the second set so as to form a single continuous helical current path through the conductors and the interconnects wherein the helical current path also turns around the central axis.

9. The method of claim 8, wherein the conductors of the first and second sets are evenly distributed in a respective annular region of the lower and upper dielectric layers, each angular region being defined by two co-centric closed loops including a small one and a large one that have a similar shape.

10. The method of claim 9, wherein each conductor of the first and second sets has an inner end on a respective small closed loop and an outer end on a respective large closed loop in the lower and upper dielectric layers, and an inner end of a conductor of the first set is electrically connected to an inner end of a conductor of the second set and an outer end of the conductor of the first set is electrically connected to an outer end of a conductor of the second set.

11. The method of claim 8, wherein the conductors and interconnects constituting the helical current path are insulated by dielectric material.

12. The method of claim 8, wherein the helical current path has first and second terminals, the first and second terminals being associated with first and second conductors of the first and second sets, respectively.

13. The method of claim 8, wherein each conductor of the first set is substantially parallel to a respective conductor of the second set.

14. The method of claim 13, wherein the conductor of the first set is electrically coupled to the respective conductor of the second set by a respective interconnect.

15. A method of forming an inductor, comprising:
  forming a first set of electrically insulated conductors in a first dielectric layer;
  forming a second set of electrically insulated conductors in a second dielectric layer; and
  forming a plurality of interconnects extending between the first and second dielectric layers, each interconnect coupling a conductor of the first set to a respective conductor of the second set, so as to form a single continuous helical current path through the conductors and the interconnects that turns around a respective central region in the first and second dielectric layers,
  wherein the helical current path includes a first terminal in the first dielectric layer and a second terminal in the second dielectric layer.

16. The method of claim 15, wherein the conductors of the first and second sets are evenly distributed in a respective annular region of the first and second dielectric layers, each angular region being defined by two substantially co-centric closed loops including a small one and a large one that have a similar shape.

17. The method of claim 16, wherein each conductor of the first and second sets has an inner end on a respective small closed loop and an outer end on a respective large closed loop in the first and second dielectric layers, and an inner end of a conductor of the first set is electrically connected to an inner end of a conductor of the second set and an outer end of the conductor of the first set is electrically connected to an outer end of a conductor of the second set.

18. The method of claim 16, wherein the shape of the two co-centric closed loops is selected from the group consisting of circle, oval, and polygon.

19. The method of claim 15, wherein the conductors and interconnects constituting the helical current path are insulated by dielectric material.

20. The method of claim 15, wherein each conductor of the first set is substantially parallel to a respective conductor of the second set.

* * * * *